United States Patent [19]
Gale et al.

[11] Patent Number: 4,749,876
[45] Date of Patent: Jun. 7, 1988

[54] UNIVERSAL POWER TRANSISTOR BASE DRIVE CONTROL UNIT

[75] Inventors: Allan R. Gale, Allen Park, Mich.; David J. Gritter, Racine, Wis.

[73] Assignee: Eaton Corporation, Cleveland, Ohio

[21] Appl. No.: 944,981

[22] Filed: Dec. 22, 1986

[51] Int. Cl.⁴ .......................... H03K 3/26; H03K 3/33; G05F 1/40
[52] U.S. Cl. ................................. 307/270; 307/280; 307/300; 323/289
[58] Field of Search ............... 307/270, 297, 280, 300; 323/289

[56] References Cited

U.S. PATENT DOCUMENTS

| | | | |
|---|---|---|---|
| 4,055,794 | 10/1977 | Ickes | 307/300 |
| 4,215,279 | 7/1980 | Lataire et al. | 307/280 |
| 4,318,011 | 3/1982 | Zeis | 307/300 |
| 4,410,810 | 10/1983 | Christen | 307/280 |
| 4,638,240 | 1/1987 | Pauker et al. | 307/300 |

Primary Examiner—Stanley D. Miller
Assistant Examiner—B. P. Davis
Attorney, Agent, or Firm—Krass & Young

[57] ABSTRACT

A saturation condition regulator system for a power transistor which achieves the regulation objectives of a Baker clamp but without dumping excess base drive current into the transistor output circuit. The base drive current of the transistor is sensed and used through an active feedback circuit to produce an error signal which modulates the base drive current through a linearly operating FET. The collector base voltage of the power transistor is independently monitored to develop a second error signal which is also used to regulate base drive current. The current-sensitive circuit operates as a limiter. In addition, a fail-safe timing circuit is disclosed which automatically resets to a turn OFF condition in the event the transistor does not turn ON within a predetermined time after the input signal transition.

14 Claims, 2 Drawing Sheets

UNIVERSAL POWER TRANSISTOR BASE DRIVE CONTROL UNIT

The U.S. Government has rights in this invention pursuant to Contract DE-AC08-84NV10366 awarded by the U.S. Department of Energy.

FIELD OF THE INVENTION

This invention relates to power transistors and more particularly to an active base drive control circuit which causes the power transistor to operate just into saturation; i.e., in a "quasi-saturated" state. Therefore, the power transistor may be rapidly switched between ON and OFF conditions.

BACKGROUND OF THE INVENTION

Power transistors with heavy current carrying capabilities are used in a wide variety of applications including, for example, the switching of current through the windings of an induction motor at a rate established by a switching signal source which in turn may be controlled as a function of desired motor speed. Many other examples of power transistor applications will occur to those skilled in the electronics art.

It is frequently highly desirable to utilize a power transistor in an applcation, such as the application mentioned above, where rapid and precise transitions between full ON and full OFF conditions of operation can be achieved. As is well known, the voltage between the collector and base elements ($V_{CB}$) of the transistor determines a transition from an unsaturated level to a hard saturation level. The unsaturated condition provides fast switching times but results in excessive system power dissipation. Hard saturation, while providing low power dissipation during the ON time, causes excess minority carriers in the base region of the transistor resulting in undesirable storage and fall times. In short, it is desirable to be able to control the operation of the power transistor in a switching application to balance the desired switching time of the transistor with the system power dissipation and transistor dissipation. This balance can be achieved by maintaining the transistor in a "quasi" saturation condition; i.e., around the area of saturation ($V_{CB}=0$ volts).

A class of circuits known as "Baker clamps" is commonly used to maintain a desired collector base voltage level; see for example, "Baker Clamps, Traditional Concepts Updated for Third Generation Power Transistors" *Powerconversion International*, July/August 1984, pages 40-45.

The traditional Baker clamp provides its effectiveness at the expense of added drive transistor collector current and higher base drive power dissipation. In adddition, variations in circuit parameters require higher base drive source voltages, typically 7 or more volts, to insure that adequate regulated base current is available to turn ON and sustain the transistor. Any variation in this voltage results in significant degradation of the base drive performance and increased power dissipation. The circuit "solid state drive" referenced in the above-mentioned article uses an NPN and PNP transistor in a common emitter configuration driving the drive transistor. With the base of each tied together the base to emitter junctions of the base drive transistors form the diodes in the base portion of the conventional Baker clamp. This configuration is desirable from a parts standpoint but is susceptible to base emitter temperature changes just as the conventional Baker clamp diodes are also susceptible to temperature changes but to a lesser degree. These changes create undesirable changes in the $V_{CB}$ over the operating temperature range of each component. Additional diodes used to adjust the $V_{CB}$ further aggravate the temperature problem. Further complications include the inability of the user to conveniently select the desired $V_{CB}$ due to the incremental voltage changes that each Baker clamp diode brings to the system. In short it is desirable to control the $V_{CB}$ independent of the system operating temperature. Another disadvantage of the Baker clamp arises out of the fact that excess base drive current is simply routed by a passive diode into the controlled transistor output circuit. This extra output circuit current creates heat and represents power dissipation. By way of example, five amps of base drive may be available to a transistor requiring only 1 amp for saturation. The excess 4 amps may be dumped off by a Baker clamp diode. The base drive must then fall below one amp before any shut-off progress can be made.

BRIEF DESCRIPTION OF THE INVENTION

The present invention is, broadly defined, a circuit for maintaining a bipolar power transistor in an operating condition just into the area of saturation, hereinafter referred to as "quasi-saturation", whereby excess charge carriers are not generated and the transistor is susceptible of rapid transitions between ON and OFF conditions. This circuit includes active elements connected in one or more feedback loops to effectively monitor a transistor input parameter, generate an error signal representing an undesirable departure from a regulation state and apply the error signal to adjust the transistor base drive.

In a preferred form, the present invention provides a control circuit for accurately maintaining the desired maximum base current and $V_{CB}$ saturation level in the operation of a power transistor, particularly a transistor utilized in a current switching application. In the preferred form, the invention provides closed loop active regulation of both forward biasing base drive current and collector-to-base voltage in the power transistor under all pertinent conditions of operation and is believed, as a result of the independent regulation of maximum base current $I_B$ and collector-to-base voltage $V_{CB}$, to maintain a far more precise level of saturation with less base drive power dissipation than is possible utilizing the principally passive elements of the Baker clamp.

In general, the illustrated embodiment of the invention comprises, in combination with a power transistor having collector, base and emitter elements, an input circuit which provides a control signal corresponding to the preferred power transistor saturation level, at least one base drive power control element connected to supply base drive current to the power transistor, means for producing a signal representing base current, means for producing another signal representing the collector-to-base voltage, first regulator means connected to receive the control signal and the base drive signal and to maintain the base current below a maximum current level so that during a fault the transistor can be quickly brought out of saturation; e.g., a short in the load or a transistor failure; and second regulator means, essentially independent from the first regulator means, connected to receive the control signal and the collect-to-base voltage signal and to regulate the power control element so as to control $V_{CB}$ to prevent oversaturation.

The typical application of the invention includes, as will be apparent to those skilled in the art, a second base drive control device connected to the base and operated complementally with the first power control element to provide a reverse bias current. These forward and reverse bias control devices are implemented as FET's. The forward bias FET is operated in the linear mode while the reverse bias device may simply function as a switch. The linear FET is connected to a positive source of potential and the switching FET is connected to a negative source of potential so that both forward biasing and reverse biasing base drive currents can be generated.

The illustrated embodiment utilizes an NPN power transistor. Although not specifically illustrated, it should be obvious to those familiar with the art that the system of the present invention can readily be adapted to regulate a PNP power transistor.

A further advantage of the invention may be conveniently and inexpensively realized by and through the use of two simple potentiometers as a principal part of the input control signal source whereby the circuit is easily adjusted in the event it is necessary to replace one power transistor with another.

Another aspect of the invention, disclosed herein as an input control or timing circuit, but susceptible of other uses, is a transition-responsive, fail-safe actuating system which produces an output condition in response to an input transition, but terminates the output condition unless a feedback return, signifying the achievement of a satisfactory condition in a remote device, is received within a predetermined time.

The invention may be best understood from a reading of the following specification which describes a preferred embodiment of the invention. This description is to be taken with the accompanying drawings.

DETAILED DESCRIPTION OF THE ILLUSTRATIVE EMBODIMENT

Figure 1:
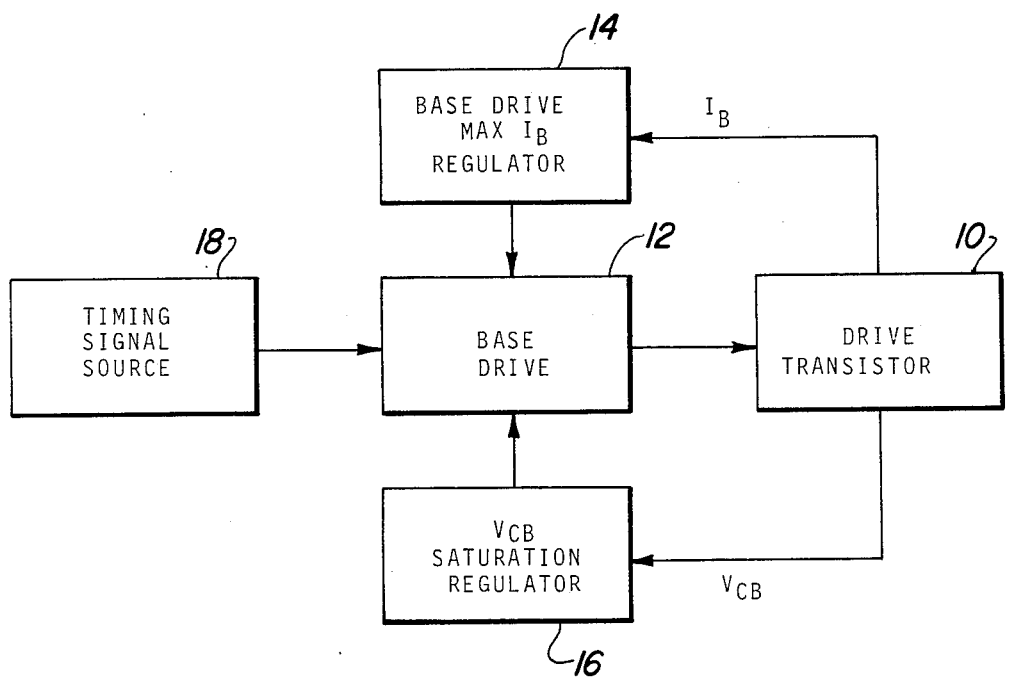
FIG. 1 is a block diagram of a circuit embodying the invention.

Referring to FIG. 1, the block bearing reference character 10 represents a large-current capacity power transistor in combination with a supply voltage source, and a load. The transistor may be NPN, PNP, Darlington or triple Darlington in configuration. In any case, the transistor has an input circuit and an output circuit. According to conventional practice, the input circuit of an NPN transistor is the base-emitter circuit and the output circuit is the emitter-collector circuit. The transistor of block 10 is connected to receive base drive current from a source 12 which, in addition to being regulable in accordance with the invention, is adjustable by the user to accommodate the substitution of different transistors into block 10 so as to operate the transistor, when turned on, within very narrow limits around the saturation point.

To prevent excess base drive current to transistor 10, a maximum base drive current regulator 14 is connected to receive a feedback signal from transistor 10 and to produce an output to base drive source 12 to actively reduce drive current if the feedback signal indicates an excess.

To maintain transistor 10 at saturation and to prevent hard saturation as indicated by a high collector-to-base voltage in transistor 10, a $V_{CB}$ saturation regulator 16 is connected to receive a feedback signal from transistor 10 and to produce an output to base drive source 12 to regulate the base drive current. As is hereinafter more fully described with reference to FIG. 2, regulators 14 and 16, although they both affect base drive current, operate independently of one another.

Signals to turn transistor 10 ON and OFF according to a desired schedule are derived from source 18 which is connected directly to the base drive source 12. Source 18 or an extension thereof may drive several additional transistors in a multiple load system such as a multiple-winding induction motor.

Figure 2:
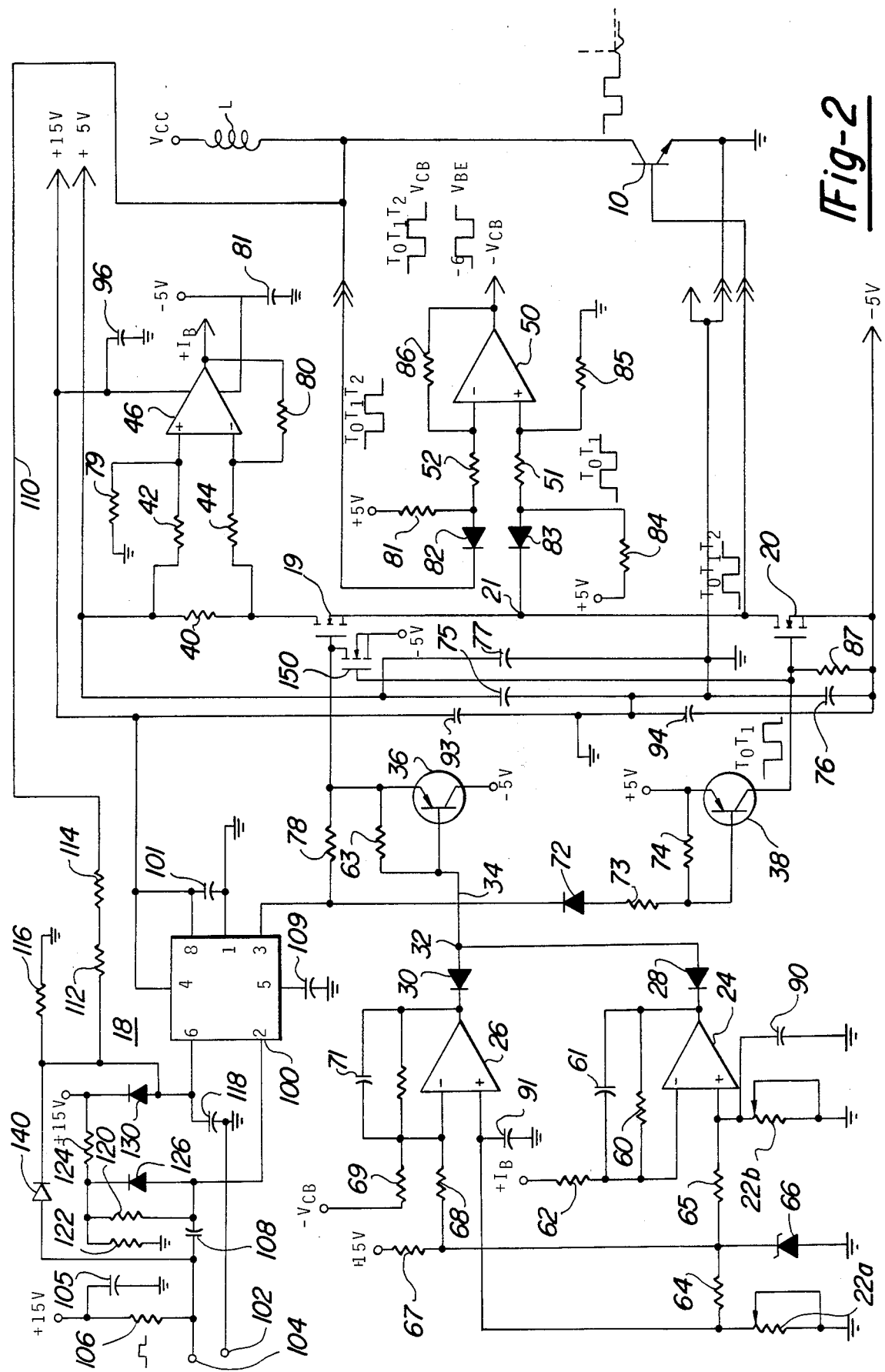
FIG. 2 is a schematic circuit diagram of a circuit embodying the invention.

Referring to FIG. 2 of the drawing, power transistor 10 is shown to be of the NPN type and to have a collector, a base and an emitter. An inductive load L is connected in the collector-emitter circuit to receive excitation from a supply voltage source $V_{cc}$. A base drive control circuit comprises field effect transistors 19 and 20. FET 19 functions as a linear device and operates to turn transistor 10 on. FET 20 functions as a switch to turn transistor 10 off. The two FETs 19 and 20 are connected as hereinafter described to the timing signal source 18 so that the FETs 19 and 20 are operated in a coplementary fashion; i.e., one FET is turned ON while the other is turned off.

FETs 19 and 20 are connected together to form a common junction 21 which is connected to the base electrode of power transistor 10. The opposite terminal of FET 19 is connected through current sense resistor 40 to a +5 volt source to provide forward biasing current to the power transistor 10 through the junction 21 when FET 19 is on. The opposite terminal of FET 20 is connected to a negative 5 volt source to provide a reverse bias current to the base electrode of power transistor 10 by way of the junction 21 when FET 20 is on. In this fashion, the power transistor 10 can be turned ON by applying a positive voltage on the gate of FET 19 with respect to the source of FET 19 and OFF by applying a positive voltage on the gate of FET 20 with respect to the source of FET 20.

In accordance with the invention, the circuit of FIG. 2 comprises two base drive set point references 22a and 22b which, in this case, are simple potentiometers for providing control signals representing a preferred power transistor saturation level; as previously described, this preferred level is user adjustable but is typically slightly saturated to optimize the switching speed of the transistor 10 with the system losses. This insures that excessive minority carriers are not built up in the base region of the transistor 10 during the ON times thereby making it more difficult and time-consuming to turn the transistor OFF. The input signal reference 22a and 22b are connected to one input of each of a pair of regulator op amps 26 and 24, respectively, op amp 24 being dedicated to regulate the base drive current $I_B$ of power transistor 10 whereas regulator op amp 26 is dedicated to the control of the collector base voltage $V_{CB}$ of the power transistor 10 as hereinafter described in greater detail.

The outputs of the regulator op amps 24 and 26 are connected through respective diodes 28 and 30 to a common junction 32 which is connected through line 34 to the base of a proportionally operating regulator transistor 36 having a bias resistor 63 connected between base and emitter. This PNP-type transistor has its emitter electrode connected to receive a voltage input from the timing signal source 18 and also to the gate electrode of FET 19 to control the operation of FET 19 in a linear fashion. The collector electrode of PNP regulator transistor 36 is connected to a negative 5 volt source. In essence, turning transistor 36 harder ON tends to reduce the gate voltage applied to FET 19 and thereby reduces the forward base drive to power transistor 10, resulting in a higher $V_{CB}$.

Another output of timing signal source 18 is connected to the base electrode of a second PNP transistor 38, through diode 72. Diode 72 is used to protect transistor 38 from excessive reverse base emitter voltage during the ON time of transistor 19. Resistor 74 is connected between emitter and base for bias. The turn-off signal from source 18 is received via resistor 73 and diode 72. The collector of 38 is connected to the gate electrodes of FETs 20 and 150 to turn FETs 20 and 150 ON during that portion of the overall timing cycle when power transistor 10 is to be OFF. It will be noted that only FET 19 is operated as linear regulator. Transistor 36 is connected to receive inputs from both of the the op amps 24 and 26.

The sensing of the base drive current need only take place on the forward biasing side of the circuit consisting of FET 19 and current sense resistor 40. For this reason the current-sensing resistor 40 is connected in series with the +5 volt supply and drain of FET 19. The opposite sides of the resistor 40 are connected by way of resistors 42 and 44 to opposite inputs of a differential amplifier 46 which forms a principal component of the maximum base drive regulator 14 shown in FIG. 1. The output of amplifier 46 (reference symbol $I_B$) is connected to the negative input of the base drive current regulator op amp 24. At this point, the actual base drive current is compared with the desired or reference level signal from reference 22b and a regulated output is connected through diode 28 to the base electrode of regulator transistor 36 to bring base drive current back below the maximum base current level.

A differential amplifier 50, which forms a principal component of the $V_{CB}$ regulator 16 of FIG. 1, has one input connected via resistor 51 and diode 83 to the junction 21. Resistor 84 is connected between +5 volts and the junction of resistor 51 and diode 83. The second input is connected via resistors 52 and diode 82 to the collector of transistor 10. Resistor 81 connects the +5 volt source to the junction of resistor 52 and diode 82. Diodes 82 and 83 provide high voltage isolation between the collector of transistor 10, and the matching bias currents for diode 82 and 83 are supplied by resistors 81 and 84, respectively. With the network configuration of 82,81 and 83,84 the output of amplifier 50 will be OFF (low) when transistor 10 is off. The low output of amplifier 50 combined with the response time of amplifier 26 set by resistor 70 and capacitor 71 act to provide maximum base current during transistor 10 turn on; i.e., the $V_{CB}$ regulator effectively begins regulation after the transistor has had time to turn ON. The inputs to amplifier 50, therefore, represent the signal quanity $V_{CB}$ and the output of the amplifier 50 is connected (reference symbols $V_{CB}$) to the negative input of the $V_{CB}$ regulator op amp 26 via resistor 69. The $V_{CB}$ signal is compared to the target level set by input device 22a and the output, which represents an error signal, is connected through diode 30 to the common junction 32 and then to the base electrode of the regulator transistor 36. Again, the elements are selected and interconnected so that a measured $V_{CB}$ which begins to go negative, results in the reduction of the forward bias current to the power transistor 10, this being accomplished by increasing the conductivity of regulator transistor 36.

Describing FIG. 2 in greater detail, amplifier 24, which is part of the $I_B$ regulator 14 of FIG. 1, has its response time set by resistor 60 and capacitor 61 which are connected in parallel between the amplifier output and the negative input; i.e., the input which receives the $I_B$ feedback signal through resistor 62.

Zener diode 66 and resistor 67 provides a 2.5 volt reference to both reference sources 22a and 22b. A 10k resistor 64 connects the diode 66 to the reference 22a and a 10K resistor 65 connects the diode 66 to the reference 22b. Capacitors 90 and 91 acts as a noise filter to amplifiers 24 and 26, respectively.

Capacitors 75, 76, 93 and 94 are power supply filter capacitors. Resistor 87 is a bias element for FET 20. Resistor 85 is a bias element for amplifier 50. Resistor 80 provides feedback from the output of amplifier 46 to its negative input.

Amplifier 46 and resistors 42, 44, 79 and 80 form a differential amplifier familair to those skilled in electronics art. The amplifier 46 effectively measures the voltage across resistor 40. Capacitors 81 and 96 provide power supply decoupling for the −5 volt and +15 volt supplies, respectively.

Looking now to the upper left portion of FIG. 2, the timing signal source 18 will be described in detail. It is to be understood that the circuit of FIGS. 1 and 2 thus far described may operate satisfactorily in response to any suitable square wave input, but the timing source 18 shown schematically in FIG. 2 provides certain additional advantages.

The heart of the timing signal source 18 is the 8-pin integrated circuit 100, shown in this case as an NE555, a commercially available integrated circuit device. The pins of the integrated circuit 100 are numbered 1 through 8 in conventional fashion but have special functions in the circuit of FIG. 2 as hereinafter described.

Pin 1 is connected to ground and pin 8 is connected to the +15 volt source to establish a total supply voltage to the integrated circuit 100 of 15 volts. Capacitor 101 is connected between pins 1 and 8. Pin 2 is the trigger input and is connected to the input terminals 102 and 104 across which the positive and negative going transitions of the basic timing signal appear. The input terminal 102 is connected to ground. A decoupling capacitor 105 is connected from +15 volts to ground. Resistor 106 is connected between +15 volts and 104 and the capacitor 108 couples the input transition to pin 2 of the integrated circuit 100. Pin 3 is the output of the integrated circuit 100 and is connected by way of resistor 78 to the input or control of FET 19 and through diode 72 and resistor 73 to the unregulated turn OFF transistor 38. A negative going transition appearing across terminals 102 and 104 causes a positive going transition in the output of the integrated circuit 100 appearing at pin 3. Pin 4, which is the standard reset pin, is effectively disabled in this application by connection to the +15 volt source. Pin 5 is grounded through capacitor 109. Pin 6 is, in this application, a reset input and is connected to the collector of the power transistor 10 through feedback line 110 and resistors 112 and 114. The resistors 112 and 114, in combination with a grounded resistor 116 and a capacitor 118 establish a timing function which, in essence, resets the integrated circuit 100 if the collector voltage of the power transistor 10 either fails to turn on or goes out of saturation after turning on. If either event occurs after the negative transition at pin 2 is gone, circuit 100 is reset. Pin 7 is not used in the application being described.

The effective time during which a negative transition across terminals 102 and 104 will continue through the integrated circuit 100 to try to turn ON power transistor 10 is determined by the combination of capacitor 108 and resistor 120; i.e., the negative transition operates through capacitor 108 to apply a voltage to pin 2 of the integrated circuit 100 which is less than 5.0 volts for a duration which is determined by the time constant of the network comprising capacitor 108 and resistors 120, 124 and 122. As long as the voltage of pin 2 is less than 5.0 volts; i.e., effectively one-third of the supply range defined by the combination of the ground connected to pin 1 and the +15 volt source connected to pin 8, the output of pin 3 will remain high. However, the voltage at pin 2 rises after a negative transition across capacitor 108 until it eventually exceeds 5.0 volts. If transistor 10 turns ON during this time, the signal fed over feedback line 110 through resistors 112 and 114 and filtered by capacitor 118 goes low and the threshold requirements are no longer applicable. If, however, the threshold voltage applied to pin 6 through resistors 112, 114 and capacitor 118 remains high, indicating that transistor 10 has not turned ON, and the voltage at pin 2 rises above 5.0 volts, the circuit 100 terminates the positive output at pin 3 and will not try to turn transistor 10 ON until another negative going transition has been received on pin 2.

Diode 130, connected between resistor 112 and +15 volts, clamps the voltage from resistor 112 to protect circuit 100 from damage. Diode 140 takes the turn off or high voltage level from terminal 104 and directs it to pin 6 of device 100 to terminate the output from pin 3 during normal operation.

Reviewing the operation of circuit 18, the initial condition is assumed to be that which follows a positive transition across terminals 102 and 104; i.e., power transistor 10 is OFF. The corresponding conditions in the balance of the circuit are as follows: regulator transistor 36 is OFF and FET 19 is OFF. Unregulated transistor 38 is ON and FET 20 is ON. The high collector voltage in power transistor 10 is communicated through resistors 112 and 114 and clamped by diode 130 to pin 6 of the integrated circuit 100 and the device is in the "reset" condition.

The negative going transition across the input terminals 102 and 104 is communicated through capacitor 108 to pin 2, dropping the voltage of pin 2 below 5.0 volts and overriding pin 6. If transistor 10 turns ON as a result of FET 19 turning ON, the collector voltage at transistor 10 goes low. This low going voltage is communicated back through feedback line 110 and the short time constant circuit comprising capacitor 118 and resistors 112, 114 and 116 to lower the threshold condition in pin 6. As long as this low going feedback signal is communicated to pin 6 before the signal condition at pin 2 rises above 5.0 volts, the positive output condition from pin 3 is maintained.

It will be apparent from the foregoing description that the time constants of the circuit 112, 114, 116 and 118 is shorter than the time constant of the circuit 108 and 120.

By way of additional detail the values of the elements used in the circuit of FIG. 2 are as follows:

| R 22a | 10K |
|---|---|
| R 22b | 50K |
| R 60 | 500K |
| C 61 | 10 pF |
| R 62 | 10K |
| R 63 | 2.2K |
| R 64 | 10K |
| R 65 | 10K |
| R 67 | 2K |
| R 68 | 24K |
| R 69 | 10K |
| R 70 | 500K |
| C 71 | 10 pF |
| R 73 | 560 |
| R 74 | 220 |
| C 75 | 470 uF |
| C 76 | .1 F |
| C 77 | .1 uF |
| R 78 | 300 |
| R 79 | 16.6K |
| R 80 | 16.6 |
| C 81 | .1 uF |
| R 84 | 220 |
| R 51 | 10K |
| R 52 | 10K |
| R 86 | 10K |
| R 42 | 4.99K |
| R 44 | 4.99K |
| R 87 | 100 |
| R 106 | 750 |
| C 105 | 0.1 |
| C 108 | .001 uf |
| R 122 | 30K |
| R 120 | 15K |
| R 124 | 15K |
| C 118 | 68 pf |
| R 116 | 100K |
| R 120 | 15K |
| R 124 | 15K |
| R 128 | 30K |
| R 112 | 100K |
| R 114 | 100K |
| C 101 | 10 |
| C 109 | 0.1 |
| R 67 | 2K |
| C 93 | 15 uf |
| C 94 | 470 |
| C 91 | 0.1 |
| C 96 | 0.1 uf |

Reviewing overall operation, the timing signal sources from device 18 are applied to the inputs of transistor 19 and 38 to cause complemental operation of those transistors and of the FET switches 19 and 20 to turn the power transistor 10 ON and off. References 22a and 22b are used to set the collector base voltage and base current respectively of power transistor 10. Regulator devices 24 and 26 maintain the base drive to transistor 36 and the gate voltage at FET 19 within a very narrow range of limits thereby to ensure that power transistor 10 never is driven toward a hard saturation condition.

What is claimed is:

1. Apparatus for regulating the operation of a power transistor immediately in the vicinity of saturation during the ON time thereof, comprising:
    a power transistor having input and output circuits;
    a timing signal source generating signals for turning the transistor ON and OFF;
    a base drive circuit connected to the input circuit of the transistor and responsive to timing signals for generating a base drive when the transistor is to be turned ON and for altering the base drive when the transistor is to be turned OFF;

means responsive to a measured parameter in the input circuit of the transistor to produce a feedback signal representing a regulated state of the transistor;

a user adjustable power transistor regulation setpoint reference; and regulator means connected to receive the feedback signal and the regulation setpoint reference for producing an error signal, said error signal being connected to the base drive circuit to alter the base drive to maintain the transistor in a desired condition during the ON time thereof.

2. Apparatus as defined in claim 1, wherein said means responsive to a measured parameter includes a first amplifier, and said regulator means comprises a second amplifier, said second amplifier being connected to receive the feedback signal from the first amplifier and to receive the reference signal and to compare the two signals for producing the error signal.

3. Apparatus as defined in claim 2 wherein the measured parameter is the base drive current.

4. Apparatus as defined in claim 2 wherein the measured parameter is the collector base voltage of the power transistor.

5. A circuit for independently controlling the base drive current $I_B$ and the collector-base voltage $V_{CB}$ in a power transistor having collector, base and emitter elements and a load in the collector-emitter circuit comprising:

input means for producing a first control signal corresponding to a maximum base current level and a second control signal corresponding to a preferred power transistor saturation level;

at least a first base drive switch connected to the base element of the power transistor to supply forward base drive current thereto;

a switching signal source connected to said switch to operate same at a desired rate;

means for producing a first signal representing $I_B$;

means for producing a second signal representing $V_{CB}$;

first regulator means connected to receive the first control signal and the first signal for producing an output which is applied to regulate the switch to prevent the forward biasing base drive current from exceeding the maximum base current level; and second regulator means connected to receive the second control signal and the second signal for producing an output which is applied to control the switch to reduce the forward base drive whenever $V^{CB}$ goes below a level corresponding to the preferred power transistor saturation level.

6. A circuit as defined in claim 5 further including a proportionally operating transistor connected to receive the output of the first and second regulator means to be controlled proportionally thereby, said transistor having an output connected to control the base drive switch.

7. A circuit as defined in claim 5 wherein the first regulator means comprises a current-sensing resistor connected in circuit with the switch, a differential amplifier having inputs connected to the opposite sides of said current-sensing transistor, and amplifier means connected to receive the output of the differential amplifier and the control signal and operative to produce a regulation signal output related to the difference therebetween.

8. A circuit as defined in claim 5 wherein the second regulator means comprises a differential amplifier having inputs connected to the base and collector elements of the power transistor to produce an output representing the voltage across the collector and base elements, and an amplifier connected to receive the output of the differential amplifier and the control signal and producing a regulated output signal corresponding to the difference therebetween.

9. A circuit as defined in claim 5 further including a second base drive switch having an output connected to the base element of the power transistor and an input connected for complemental operation with the first switch, the first switch being connected to control a positive potential source to turn the power transistor ON, and the second switch being connected to a negative potential source to turn the power transistor OFF.

10. Apparatus as defined in claim 1 wherein said source of timing signals includes a bistable device having a trigger input, a reset input and an output which changes with voltage transitions applied to the trigger input;

and feedback means connecting the output circuit of the power transistor to the reset input to reset the bistable device to an initial condition in the event the power transistor comes out of saturation.

11. A timing circuit for applying turn ON signals to a controllable device such as a transistor and for maintaining said turn ON signals for a predetermined time comprising:

first means responsive to an input signal transition of predetermined polarity to produce a trigger signal of predetermined duration;

second means connected to the controllable device responsive to the trigger signal during a portion of the duration thereof to produce an output of predetermined character adapted to switch the controllable device from one condition to another condition; and feedback means from the controllable device to said second means for terminating the output of predetermined character in the event the controllable device does not switch within a predetermined period of time.

12. A bistable transistor control circuit comprising:

a bistable device having a trigger input, a reset input and an output, the signal condition at said output reflecting the polarity of the last-applied voltage transition at said trigger input;

a controlled transistor, having input and output circuits;

means connected between the output of the bistable device and the input circuit of the transistor to turn the transistor off when the output is in a first signal condition and to turn the transistor on when the output is in a second signal condition; and feedback means connecting the output circuit of the transistor to the reset input to reset the bistable device to the first output signal condition when the transistor initiates a transition from off to on.

13. Apparatus as defined in claim 12 further including:

a first reactive circuit having a first time constant connected in said feedback means;

a second reactive circuit having a second time constant connected to said trigger input to maintain a predetermined input signal level for a predetermined time after a transition;

said second time constant being longer than the first.

14. Apparatus as defined in claim 12 wherein said device is an NE 555 or equivalent.

* * * * *